(12) United States Patent
Minopoli et al.

(10) Patent No.: US 11,392,515 B2
(45) Date of Patent: Jul. 19, 2022

(54) CACHE ARCHITECTURE FOR A STORAGE DEVICE

(71) Applicant: Micron Technology, Inc., Boise, ID (US)

(72) Inventors: Dionisio Minopoli, Arzano (IT); Daniele Balluchi, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 74 days.

(21) Appl. No.: 16/963,110

(22) PCT Filed: Dec. 3, 2019

(86) PCT No.: PCT/IB2019/001202
§ 371 (c)(1),
(2) Date: Jul. 17, 2020

(87) PCT Pub. No.: WO2021/111156
PCT Pub. Date: Jun. 10, 2021

(65) Prior Publication Data
US 2021/0406203 A1 Dec. 30, 2021

(51) Int. Cl.
*G06F 13/16* (2006.01)
*G06F 12/10* (2016.01)
(Continued)

(52) U.S. Cl.
CPC .......... *G06F 13/1668* (2013.01); *G06F 12/10* (2013.01); *G06F 12/121* (2013.01); *G06F 2212/657* (2013.01); *G11C 16/0483* (2013.01)

(58) Field of Classification Search
CPC .... G06F 13/1668; G06F 12/10; G06F 12/121; G06F 2212/657; G11C 16/0483
See application file for complete search history.

(56) References Cited

U.S. PATENT DOCUMENTS 7,401,188 B2 * 7/2008 Matthews ........... G06F 12/0888
711/118
7,469,320 B2 * 12/2008 Bonwick ............. G06F 12/0802
711/133

(Continued)

OTHER PUBLICATIONS

International Search Report and Written Opinion from related PCT Application No. PCT/IB2019/001202, dated Aug. 28, 2020, 12 pages.

*Primary Examiner* — Idriss N Alrobaye
*Assistant Examiner* — Richard B Franklin
(74) *Attorney, Agent, or Firm* — Brooks, Cameron & Huebsch, PLLC

(57) ABSTRACT

The present disclosure relates to a method for improving the reading and/or writing phase in storage devices including a plurality of non-volatile memory portions managed by a memory controller, comprising:
providing at least a faster memory portion having a lower latency and higher throughput with respect to said non-volatile memory portions and being by-directionally connected to said controller;
using said faster memory portion as a read and/or write cache memory for copying the content of memory regions including more frequently read or written logical blocks of said plurality of non-volatile memory portions.
A specific read cache architecture for a managed storage device is also disclosed to implement the above method.

18 Claims, 12 Drawing Sheets

(51) Int. Cl.
    *G06F 12/121* (2016.01)
    *G11C 16/04* (2006.01)

(56) References Cited

U.S. PATENT DOCUMENTS

| | | |
|---|---|---|
| 2006/0136668 A1 | 6/2006 | Rudelic |
| 2008/0263259 A1 | 10/2008 | Sadovsky et al. |
| 2010/0030987 A1 | 2/2010 | Na et al. |
| 2011/0191522 A1* | 8/2011 | Condict ............... G06F 12/123 711/103 |
| 2012/0017039 A1 | 1/2012 | Margetts |
| 2017/0017580 A1 | 1/2017 | Wilkerson et al. |
| 2019/0087125 A1* | 3/2019 | Matsumoto ......... G06F 12/0868 |
| 2020/0387448 A1* | 12/2020 | Thomasson ........... G06F 3/0641 |

* cited by examiner

400

| LBA[26:13] | LBA Region | Read Region Counter |
|---|---|---|
| 0000h | 0 | $RdCnt_0$ |
| ... | ... | ... |
| m | m | $RdCnt_m$ (Hot LBA Region |
| ... | ... | ... |
| j | j | $RdCnt_j$ (Cold LBA Region |
| ... | ... | ... |
| 3FFFh | 16383 | $RdCnt_{16383}$ |

| LBA[26:13] | LBA Region | Write Region Counter |
|---|---|---|
| 0000h | 0 | $WrtCnt_0$ |
| ... | ... | ... |
| m | m | $WrtCnt_m$ (Hot LBA Region |
| ... | ... | ... |
| j | j | $WrtCnt_j$ (Cold LBA Region |
| ... | ... | ... |
| 3FFFh | 16383 | $WrtCnt_{16383}$ |

CACHE ARCHITECTURE FOR A STORAGE DEVICE

PRIORITY INFORMATION

This application is a U.S. National Stage Application under 35 U.S.C. § 371 of International Application Number PCT/IB2019/001202, filed on Dec. 3, 2019, the contents of which are incorporated herein by reference.

TECHNICAL FIELD

The present disclosure relates generally to semiconductor memory and methods, and more particularly, to apparatuses and methods related to a read and/or write cache architecture for a storage device such as a hybrid memory system.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others.

Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic lock, for example, which can be used to execute instructions for operation of the computing system.

A number of components in a computing system may be involved in providing instructions to the functional unit circuitry for execution. The instructions may be executed, for instance, by a processing resource such as a controller and/or host processor. Furthermore, as different types of operations may be executed in one or multiple clock cycles through the functional unit circuitry, intermediate results of the instructions and data may also be sequenced and/or buffered.

BRIEF DESCRIPTION OF THE DRAWINGS

FIG. 4 is a schematic view of a table showing a read region counter stored in a volatile portion of the memory system of the present disclosure;

DETAILED DESCRIPTION

Figure 1:
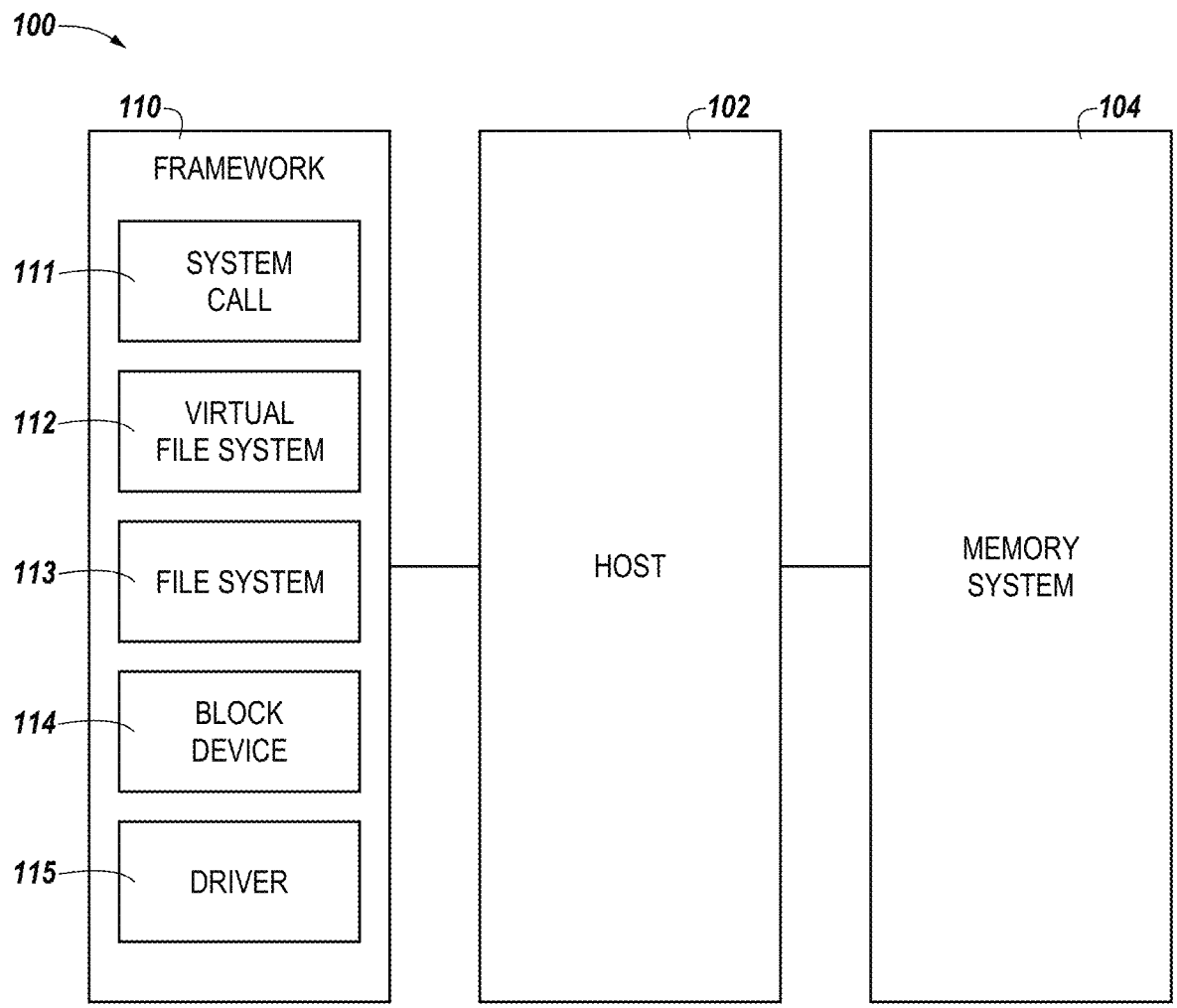
FIG. 1 is a block diagram of an apparatus in the form of a computing system including a framework, host, and memory system in accordance with a number of embodiments of the present disclosure.

The present disclosure includes apparatuses and methods related to a hybrid memory system. An example apparatus includes a hybrid memory system to couple to a host and a controller coupled to the hybrid memory system. The controller may be configured to assign a sensitivity to a command and cause the command to be selectively diverted to the hybrid memory system based, at least in part, on the assigned sensitivity.

TLC (Triple-Level Cell), QLC (Quadruple-Level Cell), SLC (Single-Level Cell) and MLC (Multi-Level Cell) NAND are used today to produce big capacity storage devices. Unfortunately, these flashes are characterized by a longer access latency than the older SLC and MLC NAND. The present disclosure suggests an enhanced storage solution which includes an emerging memory (EM) that is characterized by very low read latency and high throughput to implement a non-volatile read cache memory portion to speed-up read accesses and increases system performance of a storage device.

The present disclosure relates to a memory device, for instance a non-volatile memory device, of type defined as "managed" in the sense that an external host device or apparatus can see blocks or memory portions known as logical blocks which are selected by a logical block address (LBA).

On the contrary, the resident memory controller and the associated firmware is structured to organize the physical space of the memory device in locations knows as physical block, which are selected by a physical block addresses (PBA). The physical block addresses (PBA) may be different from the logical block addresses (LBA).

In other words, the logical and physical organization of the memory device are different and it exists a L2P table (meaning Logical-to-Physical) reporting a correspondence between the logical address used by the external entity (for instance the host device) to the physical address used by the internal controller and its firmware.

Computing systems such as personal computers, laptops, tablets, phablets, smartphones, Internet-of-Things (IoT) enabled devices, etc., may include one more memory resources to store data and/or instructions associated with the computing system. As used herein, "IoT enabled devices" include physical devices, vehicles, home appliances, and other devices embedded with electronics, software, sensors, actuators, and/or network connectivity which enables such objects to connect and exchange data. Examples of IoT enabled devices include wearable technologies, smart home devices, intelligent shopping systems, and monitoring devices, among other cyber-physical systems. In addition, computing systems may include one or more processing resources to execute system software such an operating system to provide common services for applications running on the computing system. Examples of operating systems include Linux®, Unix®, Windows®, etc.

During operation, the computing system may execute instructions such as firmware, computer code, meta-code, framework files, etc. to provide functionality to the computing system. At least some of these instructions may be executed more frequently than other instructions, and/or at least some of these instructions may be executed at particular times of operation of the computing system.

For example, if the computing system attempts to read a same portion of the instructions multiple times, an exception (e.g., a fault) may occur. In some approaches, instructions that generate such exceptions may be loaded into a cache associated with the computing system via a readahead mechanism (or other suitable prefetch mechanism) to reduce the amount of time the computing system uses in accessing the instructions multiple times. Although prefetching instructions that have experienced an exception (or are likely to experience an exception) may reduce the amount of time the computing system uses in accessing the instructions multiple times, the caches utilized in such approaches are generally not as fast as other memory resources.

In some embodiments, an exception such as a page fault may occur when a program (e.g., an application) deployed in a user space and/or a kernel service or library attempts to access an instruction stored in an internal cache associated with the computing system or a processor of the computing system and the instruction is not present in a memory (e.g., a RAM) of the computing system when the attempt to access the instruction occurs. Such exceptions may be remedied by accessing a storage device on which the instruction is stored and loading pages of memory associated with the instruction from the storage device. If readahead operations are conducted by the computing system, such exceptions may be remedied by loading contiguous of memory associated with the instructions from the storage device.

As another example, if physical memory resources become overutilized, for example, when multiple processes are executed in virtual memory, the instructions may be mapped to physical memory (e.g., physical pages of memory) prior to execution. However, if there is insufficient physical memory to map the instructions to, the physical memory resources may become over-utilized, which may result in decreased computing system performance and/or increased read/write times for the computing system.

In yet another example, certain write patterns may be common when the computing system is operating. For example, certain instructions may exhibit repetitive and/or predictable write patterns; however, in some approaches, information regarding these write patterns may not be accessible to the computing system. As a result, in some approaches, time and/or processing resources may be consumed in repetitively fetching and writing instructions that have repetitive and/or predictable read or write patterns.

In contrast, embodiments herein may reduce an amount of time and/or an amount of processing resources consumed in addressing exceptions that occur when an instruction is accessed multiple times, may provide an increase in computing speed and/or read/write times for a computing system utilizing virtual memory addressing, and/or may alleviate time and/or processing resources consumed by a computing system in repetitively fetching instructions that exhibit repetitive and/or predictable read or write patterns.

For example, in some embodiments, one or more memory resources associated with the computing system may be deployed in the form of a hybrid storage device. For example, at least one memory resource may comprise a particular type of memory resource while at least one other memory resource may comprise a different particular type of memory resource. As a non-limiting example, one memory resource associated with the computing system may be a non-volatile memory resource such as a 3D Xpoint non-volatile memory, and a second memory resource may be a different non-volatile memory resource such as a flash memory (e.g., a storage volume). Embodiments are not limited to these specific examples; however, and the memory resources that comprise the hybrid storage device may include combinations of other types of non-volatile memory (e.g., ROM, PROM, EPROM, EEPROM, NVRAM, etc.) and/or volatile memory (e.g., RAM, DRAM, SRAM, etc.).

In some embodiments, as described in more detail herein, instructions or data that are determined to exhibit certain characteristics may be stored and/or accessed from the first memory resource or the second memory resource. For example, in some embodiments, certain data may be stored and/or accessed from the first memory resource responsive to a determination that a lower latency may be realized by the computing system if the data is stored and/or accessed from the first memory resource.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, designators such as "N," etc., particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a framework 110, host 102, and memory system 104 in accordance with a number of embodiments of the present disclosure. As used herein, a framework 110, host 102, and/or memory system 104 might also be separately considered an "apparatus." In some embodiments, the memory system 104 may be a hybrid memory system as described in connection with FIG. 2.

Figure 2:
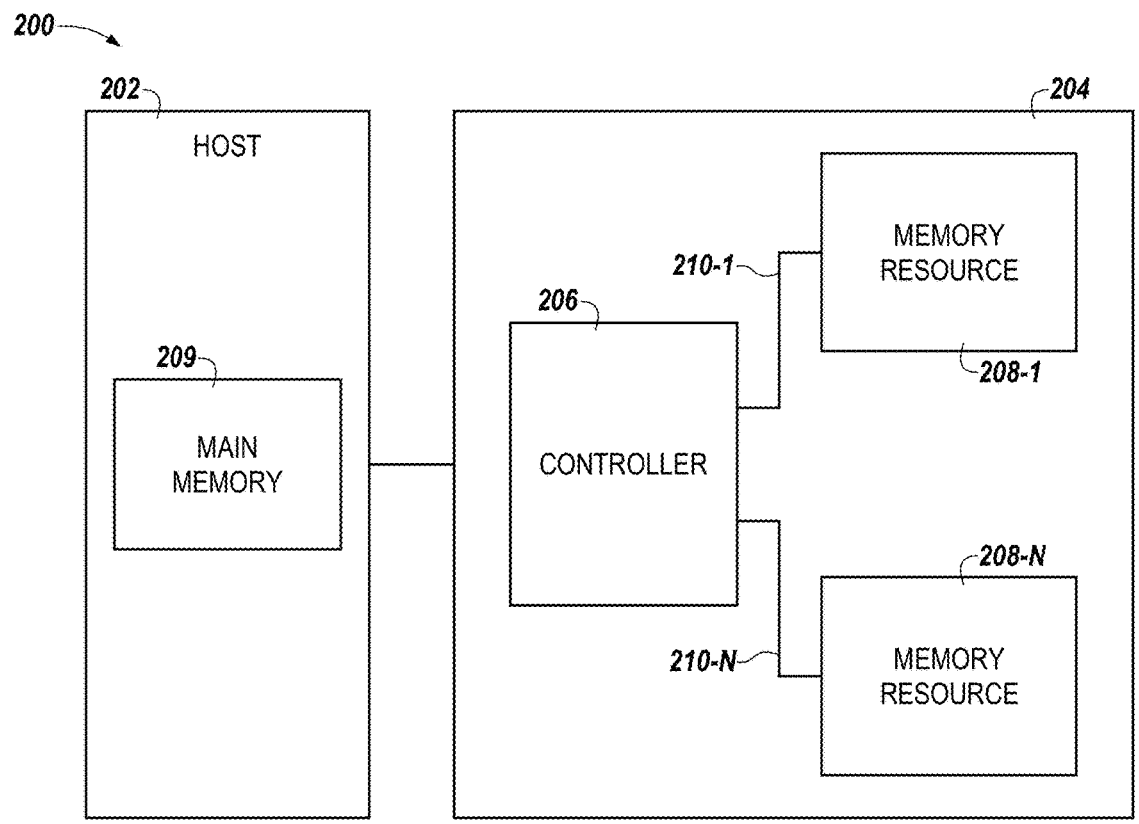
FIG. 2 is a block diagram of an apparatus in the form of a computing system including a host including a main memory, and memory system in accordance with a number of embodiments of the present disclosure.

System 100 includes a host 102 coupled (e.g., connected) to memory system 104, which includes one or more memory resources, as illustrated in FIG. 2, herein. Host 102 can be a host system such as a personal laptop computer, a desktop computer, a digital camera, a smart phone, a memory card reader, IoT enabled device, among various other types of hosts. Host 102 can include a system motherboard and/or backplane and can include a number of processing resources (e.g., one or more processors, microprocessors, or some other type of controlling circuitry). The system 100 can include separated integrated circuits or both the host 102 and the memory system 104 can be on the same integrated circuit. The system 100 can be, for instance, a server system and/or a high performance computing (HPC) system and/or a portion thereof.

For clarity, the system 100 has been simplified to focus on features with particular relevance to the present disclosure. The memory system 104 can include one or more memory resources such as a DRAM array (e.g., a 2T2C DRAM array, a 3T DRAM array, etc.), FeRAM, SRAM array, STT RAM array, PCRAM array, TRAM array, RRAM array, NAND flash array, 3D Xpoint memory, NOR flash array, and/or a storage sub-system that includes a controller, a 3D Xpoint memory portion and a NAND flash portion, for instance.

The framework 110 may include instructions executable by a processing resource associated with the host 102 to facilitate operation of the system 100. For example, the framework may include instructions executable by the processing resource of the host 102 to control computing operations such as reads, writes, opens, closes, etc., to provide one or more file systems (e.g., a virtual file system, a file system such as an extended file system, etc.), and/or one or more instructions corresponding to a block device. In some embodiments, the framework 110 may be a Linux® framework such as an Android® framework. In addition, the framework 110 may include drivers (e.g., one or more software drivers) executable to allow an operating system running on the host 102 to communicate with one or more devices coupled to the host 102.

In some embodiments, the framework 110 may represent an operating system. For example, the framework 110 may represent an operating system having a Linux® kernel associated therewith. In such embodiments, the framework 110 may be considered a "software storage stack" (e.g., the framework 110 may represent a software-based kernel implementation of an operating system).

Accordingly, the framework 110 may have one or more memory resources associated therewith to store instructions executable to operate the computing system 100 and/or the framework 110 may include virtualized memory resources on which the instructions utilized by the framework 110 for operation of the computing system 100 are stored. Embodiments are not so limited; however, the instructions and data utilized by the framework 110 may be stored in, and/or accessed from the memory system 104, or a main memory of the host as described in further detail, herein.

As described above, the framework 110 may include various components configured to perform certain tasks and/or operations. For example, the framework 110 may include a system call component 111, a virtual file system component 112, a file system component 113, a block device component 114, and/or driver component 115.

The system call component 111 may include instructions executable by a processing resource (e.g., a processing resource associated with the host) and/or may be provisioned with hardware resources on which the instructions may ultimately be executed to request one or more services from the kernel of the operating system the instructions are to be executed on. In some embodiments, the system call component 111 may be accessed via an application programming interface. When implemented, the instructions associated with the system call component 111 may transfer control of the computing system 100 from user space to kernel space. In some embodiments, this transfer of control may occur in response to a software interrupt.

The virtual file system component 112 may include instructions executable by a processing resource (e.g., a processing resource associated with the host) and/or may be provisioned with hardware resources on which the instructions may ultimately be executed to provide an abstraction layer on top of the file system component 113. For example, the virtual file system component 112 may include instructions that may be executed to access local and/or network storage devices. In some embodiments, the virtual file system 112 may include instructions that may be executed to access local and/or network storage devices transparently (e.g., without a client application interaction). The instructions associated with the virtual file system component 112 may specify an interface between the kernel and the file system component 113.

The file system component 113 may include instructions executable by a processing resource (e.g., a processing resource associated with the host) and/or may be provisioned with hardware resources on which the instructions may ultimately be executed to control how data associated with the computing system 100 is stored and/or retrieved. For example, the file system component 113 may include instructions executable to store and/or retrieve data from the memory system 104, as discussed in more detail herein.

The block device component 114 may store instructions executable by a processing resource (e.g., a processing resource associated with the host) and/or may be provisioned with hardware resources on which the instructions may ultimately be executed to reference a particular memory location or memory locations associated with the computing system 100. In some embodiments, the block device component 114 may comprise a hard disk drive and/or Solid State Drive SSD which may provide buffered access to the computing system 100. For example, the instructions associated with the block device component 114 may be executed to provide access to a device (e.g., the memory system 104) associated with the computing system 100.

The driver component 115 may include instructions executable by a processing resource (e.g., a processing resource associated with the host) and/or may be provisioned with hardware resources on which the instructions may ultimately be executed to provide driver support for various components associated with the computing system 100. For example, the driver component 115 may be configured to execute instructions to load and/or update drivers associated with the host 102, memory system 104, and/or other peripheral devices (not shown) that may be associated with the computing system 100.

In some embodiments, the various components of the framework 110 may be exhibit different access patterns, at least some of which may exhibit predictable and/or repetitive behavior, as described in more detail, herein.

Accordingly, embodiments described herein may allow for a hybrid storage system to facilitate management of the various components and/or access patterns associated with the various components of the framework 110, host 102, and/or memory system 104.

The framework 110 may be coupled to the memory system 104 via the host 102. For example, the host 102 may include one or more processing resources (e.g., computer processors such as a central processing unit and/or other computer processors) configured to execute the instructions (e.g., the instructions associated with the system call component 111, the virtual file system component 112, the file system component 113, the block device component 114, and/or the driver component 115) stored in the framework 110.

FIG. 2 is a block diagram of an apparatus in the form of a computing system 200 including a host 202 including a main memory 209, and memory system 204 (e.g., a hybrid memory system) in accordance with a number of embodiments of the present disclosure. The main memory 209 may be volatile memory such as RAM, DRAM, SRAM, etc. that may be used to store one or more pages of data associated with operation of the computing system 200.

Embodiments are not limited to volatile memory; however, and the main memory may include non-volatile memory in addition to volatile memory or in lieu thereof.

As illustrated in FIG. 2, the hybrid memory system 204 may include one or more memory resources 208-1, . . . , 208-N coupled to a controller 206. As shown in FIG. 2, the controller 206 is communicatively coupled to the memory resources 208-1, . . . , 208-N via respective communication channels 210-1, . . . , 210-N. The communication channels 210-1, . . . , 210-N may allow for data and/or commands to be transferred between the controller 206 and the memory resources 208-1, . . . , 208-N. In various embodiments, the controller 206 is responsible for causing instructions from the framework (e.g., framework 110 illustrated in FIG. 1) and/or host 202 to be executed, and/or sequencing access to the memory system 204.

The controller 206 can be a state machine, sequencer, or some other type of controller, and include hardware and/or firmware (e.g., microcode instructions) in the form of an application specific integrated circuit (ASIC), field programmable gate array, etc. The controller 206 can control, for example, access patterns of instructions executed to facilitate operation of the computing system 200.

As used herein, a host 202, memory system 204, controller 206, and/or memory resources 208-1, . . . , 208-N might also be separately considered an "apparatus."

In some embodiments, the memory system 204 may be a hybrid storage system and may include one or more memory resources 208-1, . . . , 208-N.

The memory resources 208-1, . . . , 208-N may be different kinds of memory resources. For example, memory resource 208-1 may be an emerging non-volatile memory resource such a 3D Xpoint memory resource, Ferroelectric RAM (FeRAM), etc. while the memory resource 208-N may be a NAND memory resource. Embodiments are not limited to these specific examples, and the memory resource 208-1 and/or the memory resource 208-N may comprise other suitable types of memory resources.

During operation of the computing system 200, the memory system 204 may be utilized for code paging. As used herein, "code paging" is a memory management scheme by which the computing system 200 stores and retrieves data from the memory system 204 for use by the main memory 209 (e.g., system memory) of the host 202. In some embodiments, instructions executable to facilitate code paging, which may be stored in the main memory 209 of the host 202, may be executed as part of operation of the computing system 200.

However, during operation of the computing system 200, multiple instructions (e.g., an instruction to store and/or retrieve data from the main memory 209) to access a same portion of the main memory 209 may be executed. This may lead to an exception since in some embodiments a program may access data and/or instructions that are not mapped into the main memory 209 of the computing system 200. In this case, the data and/or instructions may be accessed from the memory system 204 thereby handling a page fault that occurs as a result of the data and/or instructions not being accessible from the main memory 209. In some approaches, this exception may be handled (e.g., remedied) by providing read and/or write access to a memory location other than the main memory 209. For example, in some approaches, a readahead mechanism may be utilized to prefetch sets of instructions that have experienced an exception and store them in a cache associated with the computing system 200 and/or the host 202 for subsequent execution.

Such exceptions may be very common in operation of the computing system 200. For example, in multiprocessing computing environments, and may generate a very large quantity of read and/or write data—in some examples up to hundreds of gigabytes per day. In some embodiments, in order to alleviate the processing resources and/or time consumed in read/write operations, it may be beneficial to store instructions or data that generate a threshold number of accesses in a memory resource (e.g., memory resource 208-1) to reduce read/write latencies and to reduce an amount of processing resources consumed.

For example, in some embodiments, the controller 206 may be configured to determine that an exception corresponding to a read or write access request for a particular set of data is going to occur (or has occurred), and cause the particular set of data to be written to the memory resource 208-1 for subsequent execution and/or retrieval by the computing system 200. In some embodiments, the particular set of data may be stored in a partition or address range in the memory resource 208-1. The partition and/or address range may be allocated (e.g., reserved) such that data other than the particular data (e.g., data not corresponding to the read or write access request) is not stored in the partition and/or LBA block, as described in more detail in connection with FIGS. 3A, 3B, and 3C, herein.

As described above, the main memory 209 of the host may be a physical memory resource such as a volatile memory resource (e.g., RAM, DRAM, SRAM, etc.), non-volatile memory resource (e.g., a HDD, flash memory, ferroelectric RAM, etc.), or combinations thereof. As a result, the amount of data that can be stored in the main memory 209 may be limited due the physical nature of the main memory 209. For example, the main memory 209 may include a finite amount of space in which data may be stored.

Accordingly, under some operating conditions, the main memory 209 may become full and/or may exhibit decreased performance when the host 202 attempts to store too much data in the main memory 209. This may be further exacerbated in systems that utilize virtual memory techniques to abstract memory resources (e.g., main memory 209) to create an illusion that the amount of memory space is greater than the actual amount of physical memory space defined by the main memory 209.

In such implementations, virtual address spaces may be managed (e.g., by control circuitry such as a memory management unit associated with the host 202) using logical to physical addressing techniques. For example, virtual addresses may be assigned to corresponding physical addresses, which may correspond to a physical location (e.g., one or more pages of memory, etc.) of the main memory 209 on which a process may be ultimately executed on. However, when multiple virtual memory addresses are mapped to a same physical memory address, the computing system 200 may experience decreased performance and/or may hang (e.g., processes may be terminated and/or may behave unexpectedly).

For example, in computing implementations that utilize virtual memory techniques, one or more processes may reference one or more virtual memory locations (e.g., memory pages, memory blocks, etc.) that may be mapped onto physical memory locations of the main memory 209. Further, when the main memory 209 is full, virtual memory pages may not be able to be called since there are inadequate physical memory resources available to execute the process.

In some approaches, this may be alleviated by transferring pages of data in the main memory 209 to a swap space to free up physical memory resources of the main memory 209. For example, in some approaches, the kernel of the operating system may include a mechanism to free physical memory resources of the main memory 209 allocated for anonymous pages. As used herein, "anonymous pages" are pages of memory that do not have an associated file. For example, an anonymous page may be a page of memory that is not backed by a file (e.g., a page of memory that does not have a file specified). However, although, an anonymous page may not be related to a file, an anonymous page may be related to a process and/or a process working set. Non-limiting examples of processes and process working sets include data structures such as heaps, stacks, constants, etc.

As used herein, a process working set includes one or more pages of data in a virtual address space of the host that are stored in physical memory of the host such as the main memory of the host. For example, the process working set contains pages of memory that are visible to the main memory of the host (e.g., pages that have been recently referenced by the host).

In such approaches, the related contents of the page (e.g., the anonymous page) may be temporarily transferred (e.g., copied) to a swap space and/or a swap device. In the event that the page is subsequently referenced, the page may be transferred (e.g., copied) back to the main memory 209. However, due to the time and energy consumption associated with transferring the page from the main memory 209 to the swap space or swap device, and then subsequently transferring the page from the swap space or swap device back to the main memory 209, traditional swapping techniques may be less than desirable, especially in implementations where such techniques are repeatedly utilized. As used herein, a process working set includes one or more pages of data in a virtual address space of the host that are stored in physical memory of the host such as the main memory of the host. For example, the process working set contains pages of memory that are visible to the main memory of the host (e.g., pages that have been recently referenced by the host).

To facilitate selective transfer of data such as data corresponding to pages of memory, in some embodiments, a portion of the hybrid memory device 204 may configured to operate as a swap device (e.g., may be configured to allow for selective transfer of pages of memory to and from the portion of the hybrid memory system 204). For example, a portion of memory resource 208-1 may be configured to operate as a swap device such that pages of memory are selectively transferred to the portion of the memory resource 208-1. In some embodiments, one or more pages of memory of the memory resource 208-1 or one or more logical block addresses associated with the memory resource 208-1 may be allocated to perform swap operations.

The one or more pages of memory and/or the one or more logical block addresses may be allocated when the hybrid memory system 204 is manufactured (e.g., before the hybrid memory system 204 is offered for sale to an end user), or the one or more pages of memory and/or the one or more logical block addresses may be allocated when the hybrid memory system 204 is initialized (e.g., when the computing system 200 is booted up). Embodiments are not so limited; however, and in some embodiments, the one or more pages of memory and/or the one or more logical block addresses may be allocated by the hybrid memory system 204 dynamically during runtime of the computing system 200.

In some embodiments, the portion of the hybrid memory system 204 that is allocated as a swap device may be a portion of the hybrid memory system 200 that has a lower access time than other portions of the hybrid memory system 200. For example, the memory resource 208-1 may have a lower access time than the memory resource 208-N due to the memory resource 208-1 being an emerging type memory resource such as a 3D Xpoint memory resource. Further, in some embodiments, the portion of the hybrid memory system 204 that is allocated as a swap device may be a portion of the hybrid memory system 200 that has a higher endurance than other portions of the hybrid memory system 200.

In some embodiments, processes and/or applications executed by the host 202 may rely on a database management system (DBMS) such as NoSQL, SQLite, a cloud-based DBMS, or other suitable DBMS. The DBMS may allow an end user to create, read, update, and/or delete data in a database associated with the computing system 200. In some embodiments, the DMBS may operate according to a journaling policy, which may allow for data consistency and/or system durability to be realized. The DBMS may have commands associated therewith. In some embodiments, commands associated with the DBMS may be selectively diverted to a portion of the hybrid memory system based, at least in part, on a sensitivity assigned to the DBMS command.

The journaling system may be a journaling file system that keeps track of changes not yet committed to the file system (e.g., file system 113 illustrated in FIG. 1, herein). During operation of the computing system 200, the journaling system may incur multiple random writes that may put the memory system 204 and/or the main memory 209 under pressure. For example, the journaling system may incur multiple synchronous random and frequent writes that may over-utilize memory of the computing system 200 and/or the main memory 209 thereby putting the memory of the computing system 200 and/or the main memory under pressure.

These random and frequent writes may incur long latencies, especially in flash based memory systems, due to maintenance operations being performed in the foreground (e.g., during write command execution). These latencies may be further exacerbated in flash based memory systems under certain conditions such as when the flash based memory system is operating at or near capacity and/or when the flash based memory system has been operated for an extended period of time. In contrast, the hybrid memory system 204 may incur lower latencies than flash based memory systems over time and/or when the hybrid memory system 204 is operating at or near capacity.

In order to alleviate the deficiencies associated with flash based memory systems, some embodiments allow for the controller 206 to determine a sensitivity of command traffic handled by the DBMS and apply an indicator to certain types of command traffic based on the determined sensitivity of the traffic. The sensitivity of the command traffic may be based on characteristics of the command traffic such as the frequency of execution of a particular command, the size of the command, the amount of resources (e.g., memory resources and/or processing resources) execution of the command consumes, the speed at which the command may be executed, or other suitable sensitivity characteristics. In some embodiments, the sensitivity may be based on a write latency or a read latency associated with execution of the command. In this example, the command may be selectively diverted to the hybrid memory system 204 responsive to a determination that the write latency associated with execution of the command exceed a threshold write latency.

Once the controller 206 has appended the indicator to a command, the command may be selectively diverted to an appropriate memory location of the computing system 200. For example, command traffic that is repetitive, random, and/or frequently executed (such as the synchronous small frequent and random writes incurred by the journaling system during operation of the computing system 200), may be selectively diverted to the hybrid memory device 204. In some embodiments, the command traffic may be selectively diverted based on the indicator to a particular memory resource (e.g., memory resource 208-1) of the plurality of memory resources 208-1, . . . , 208-N associated with the hybrid memory system 204.

By selectively diverting certain portions of the command traffic to the hybrid memory system 204, lower latencies and/or increased performance may be realized in comparison to approaches in which the command traffic is either not selectively diverted or in approaches in which the command traffic is handled by a flash based memory system.

In some embodiments, the file system (e.g., virtual file system 112 illustrated in FIG. 1, file system 113 illustrated in FIG. 1) of the computing system 200 may be a flash file system such as a flash friendly file system (F2FS) or a journaling file system such as Ext4, although the file system(s) are not limited to these specific examples. The file systems may maintain their structure by specific metadata updates that are updated when a file is updated. For example, the file system of the computing system 200 may comprise data structures such as tables, trees, data arrays, etc., and may be updated when files associated therewith are updated to maintain the structure of the file system.

When the file system is updated (e.g., when metadata updates are applied to the file system in response to a file update), the updates are performed in small random writes.

As described above, these types of small random writes may put the memory system 204 and/or the main memory 209 under pressure. These random writes may incur long latencies especially in flash based memory systems due to maintenance operations being performed in the foreground (e.g., during write command execution). These latencies may be further exacerbated in flash based memory systems under certain conditions such as when the flash based memory system is operating at or near capacity and/or when the flash based memory system has been operated for an extended period of time. In contrast, the hybrid memory system 204 may incur lower latencies than flash based memory systems over time and/or when the hybrid memory system 204 is operating at or near capacity.

For example, in some embodiments, command traffic associated with file system updates (e.g., files system metadata updates) may be selectively diverted to an appropriate memory location of the computing system 200. In some embodiments, the appropriate memory location of the computing system 200 may be a portion of the hybrid memory system 204, such as memory resource 208-1. In some embodiments, the controller 206 may be configured to cause the file system updates to be selectively diverted to the portion of the hybrid memory system 204.

By selectively diverting file system writes to the hybrid memory system 204, lower latencies and/or increased performance may be realized in comparison to approaches in which the file system writes are either not selectively diverted or in approaches in which the file system writes are handled by a flash based memory system.

During operation of the computing system 200, certain file systems (e.g., virtual file system 112 illustrated in FIG. 1, file system 113 illustrated in FIG. 1) may exhibit repetitive and/or predictable write patterns. For example, F2FS checkpoints and/or the journaling system may repeatedly write certain commands and/or data in a predictable manner. These commands and/or data may be written in small random writes, as described above.

As described above, these small random writes may incur long latencies especially in flash based memory systems due to maintenance operations being performed in the foreground (e.g., during write command execution). These latencies may be further exacerbated in flash based memory systems under certain conditions such as when the flash based memory system is operating at or near capacity and/or when the flash based memory system has been operated for an extended period of time. In contrast, the hybrid memory system 204 may incur lower latencies than flash based memory systems over time and/or when the hybrid memory system 204 is operating at or near capacity.

In order to alleviate the deficiencies associated with flash based memory systems some embodiments allow for selective diversion of small random writes to a portion of the hybrid memory system 204. For example, the computing system 200 (or portions thereof) may be configured to determine a source of a write operation (e.g., a small, random writes). In some embodiments, a file system associated with the computing system 200 and/or drivers associated with the computing system 200 may be configured to associate a hint (e.g., an indicator to) metadata writes and/or data structures. The hint may be transferred into a write command, and the write command including the hint may be transferred to the hybrid memory system 204. In some embodiments, subsequent to the write command and hint associated therewith being transferred to the hybrid memory system 204, the controller 206 may be further configured to divert such file system writes (or metadata writes) to the hybrid memory system 204 to reduce access times and/or to avoid endurance its to the main memory 209, thereby increasing performance of the computing system 200.

In some embodiments, the controller 206 may be configured to selectively divert file system writes to portions of the hybrid memory system 204 that are best suited to handling the command traffic diverted thereto. For example, certain file systems may exhibit particular command traffic patterns, which may be handled most efficiently by particular types of memory. As a non-limiting example, in F2FS, Log-structured File System (LFS) writes may be executed in a determinable access pattern wherein data is sequentially written on unmapped LBAs, which may be well suited to NAND memory. In contrast, Slack Space Recycle (SSR) writes may be executed in a determinable access pattern in which data is randomly written on mapped LBAs, which may be well suited to low latency memory such as 3D Xpoint memory.

Accordingly, in some embodiments, the controller 206 can selectively divert command traffic associated with determinable write patterns to a portion of the hybrid memory system 204 that is best suited to handling a particular type of file system writes. For example, the controller 206 may be configured to divert LFS writes to memory resource 208-N, which may be a NAND memory, and/or the controller 206 may be configured to divert SSR writes to memory resource 208-1, which may be a low latency emerging memory resource, as described herein.

In some approaches, it is not possible to transmit information corresponding to an access semantic to a memory device associated with the computing system 200. For example, in some approaches, information corresponding to whether a write access request is associated with user data or file system metadata is not transmitted to a memory device associated with the computing system 200. Therefore, in some approaches, the memory device associated with the computing system 200 may not be provided with any knowledge as to whether a particular LBA or LBA range will be frequently accesses by read or write commands if the particular LBA or LBA range is stored in a storage location in which paging processes are executed.

In contrast, embodiments herein allow for the controller 206 to determine whether a write access request is, for example, associated with user data or file system metadata and/or to determine whether a particular LBA or LBA range is frequently accessed by read or write commands and selectively divert read or write commands having particular properties to the hybrid memory system 204.

Figure 3:
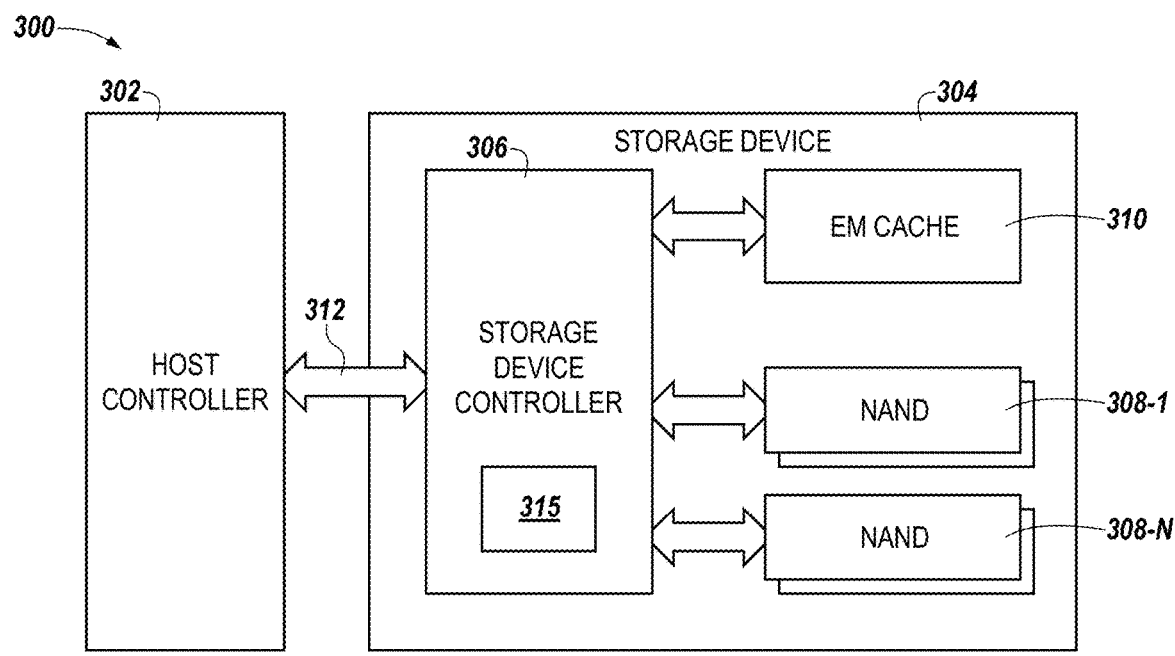
FIG. 3 shows a schematic example of a cache architecture for a hybrid or managed memory system according to embodiments of the present disclosure.

FIG. 3 shows a schematic view of a storage device 304 comprising a controller 306 and several non-volatile memory portions 308-1, . . . , 308-N, for instance NAND memory portions, typically four/eight in case of mobile storage. Those memory portions may be considered equivalent to the memory resources 208-1, . . . , 208-N shown in FIG. 2.

The controller 306 includes an embedded volatile memory portion 315, for instance a SRAM memory portion.

As previously mentioned, the storage device 304 of the present disclosure is associated to a host device or controller 302 that is in communication with controller 306 of the storage device 304 through a communication channel 312. The combination of host controller 302 and storage device 304 will be considered in the following lines an apparatus 300 for handling a managed or hybrid memory device.

The storage device 304 further includes at least a faster memory portion 310. With the term faster we intend a memory portion that has a lower latency and higher throughput if compared with the above-mentioned non-volatile memory portions 308-1, . . . , 308-N. In this embodiment disclosed with reference to FIG. 3 the faster memory portion is still a non-volatile memory but has the advantage to be bit alterable for instance a 3D cross point memory portion or, as alternative, SLC and MLC NAND memory portions.

Generally speaking, TLC and QLC NAND flash memory portions are used to implement big capacity storage device for the non-volatile memory portions 308-1, . . . , 308-N. Unfortunately, these TLC and QLC NAND flash memory portions 308-1, . . . , 308-N are characterized by a relatively higher access latency than the SLC and MLC NAND. The applicant has realized that system performance may be significantly increased combining NAND memory portions with emerging technology having a lower latency and higher throughput, for instance the 3DXP memories previously mentioned.

In one embodiment of the present disclosure the faster memory portion 310 is used as a cache memory for read accesses and related algorithms to load data from NAND and to evict data from the cache.

At least one embodiment of the present disclosure relates to a read cache architecture for a hybrid memory device including a storage device comprising:
 a plurality of non-volatile memory portions;
 a controller of the storage device by-directionally connected to the non-volatile memory portions;
 at least a faster memory portion having a lower latency and higher throughput with respect to said non-volatile memory portions and being by-directionally connected to said controller;
 said faster memory portion being the cache memory portion for the plurality of non-volatile memory portions.

Further embodiments of the present invention relate to an apparatus comprising:
 a host device;
 a storage device with a controller;
 a communication channel between the host device and the controller of the storage device, wherein
 the storage device comprises:
  a plurality of non-volatile memory portions;
  a controller of the storage device by-directionally connected to the non-volatile memory portions;
  at least a faster memory portion having a lower latency and higher throughput with respect to said non-volatile memory portions and being by-directionally connected to said controller;
  said faster memory portion being the cache memory portion for the plurality of non-volatile memory portions.

Another embodiment of the present disclosure relates to a method for improving the reading phase in storage devices including a plurality of non-volatile memory portions managed by a memory controller, comprising:
 providing at least a faster memory portion having a lower latency and higher throughput with respect to said non-volatile memory portions and being by-directionally connected to said controller;
 using said faster memory portion as a read cache memory for copying the content of memory regions including more frequently read logical block addresses of said plurality of non-volatile memory portions.

Still another embodiment of the present disclosure relates to a method for speeding-up the reading phase of a managed storage device including a plurality of non-volatile memory portions and a memory controller, comprising:

reading a logical block address of a memory region in one of said plurality of non-volatile memory portions;

updating a counter associated to each memory region at any reading access to a logical block address of that memory region;

copying in a non-volatile read cache memory portion the content the more frequently accessed memory regions when said counter overcomes a set threshold.

The present disclosure is based on the consideration that a NAND based storage device can reach good read performance if enough data are read from the same pages, different planes or dies. Sequential read accesses, performed with large chunk size, can take advantage from NAND large page size. On the other hand, to increase random read performance, long command queues are used, allowing to read data in parallel from different NAND planes or dies. Unfortunately, in mobile workloads it's common to have just few commands in command queue, therefore NAND parallelism cannot be exploited and this results in lower performances.

The present disclosure proposes a new read cache architecture based on use of emerging memory (EM) as a cache portion of the hybrid storage device. Since the emerging memory read latency is extremely lower than NAND memories, this technology can provide very high random read performance even in case of low queue depth. A read cache improves system performance if cache hit rate is high and it has low management overhead.

In other word, the NAND latency is paid at the first memory access only, while the subsequent accesses are rendered possible thought the lower latency of the faster cache non-volatile memory portion. However, the algorithm managing the cache filling and cleaning are relevant for the better optimization of the reading access.

Moreover, according to embodiments of the present disclosure, the read commands are monitored to discover which LBA should be copied in the read cache memory portion and which LBA should be removed from it. This monitoring phase is performed using a limited amount of the SRAM portion 315 which is an expensive resource in controllers 306 of storage devices 304.

A part of the following description will focus attention on the chunk size of the read instructions issued by the host controller 302 toward the storage device 304. The chunk size is the minimal number of bytes that can be exchanged any time that there is a read access to the storage device. One of the most diffused chunk size is 4 kbyte; however, studies performed by the Applicant have demonstrated that in mobile applications with a the larger chunk size it's possible to cover largest percentage of the commands exchanged by the host controller with the storage device.

Now, coming back to the example of FIG. 3, we have understood that the apparatus of the present disclosure includes a storage device architecture with a read cache memory portion that is a non-volatile memory portion structured with an emerging memory such a 3D cross point memory portion. This configuration allows obtaining a significative boost of read performance, as we will see hereinafter.

In mobile workloads, most of the read commands have small chunk sizes, for instance the mentioned 4 Kbyte size, even if most of the read traffic is due to command with big chunk size.

Emerging memory technologies with low read latency, such as the 3DXP memory portions, provide consistent read performance independently from the number of physical blocks that are concurrently read. On the contrary, a NAND memory portion is faster if enough PBA are read from the same pages, different planes or dies.

For example, a single 4 KB read is much faster from 3DXP, while a 256 KB read may be faster from NAND. Therefore, the LBAs that are frequently read in short chunks are candidates to be copied in Read Cache.

In the proposed architecture, read commands are monitored to discover which LBA should be copied in read cache and which LBA should be removed from it.

The controller 306 of the storage device 304 including the read cache memory portion 310 is configured with a resident algorithm taking care of the read cache management. This read management algorithm copies data of logical blocks, that are read frequently and in small chunks from the non-volatile memory portions 308$i$, in the faster memory portion 310, and evicts LBAs from the same memory portion 310 when they are no longer used.

To determine which LBA should be kept in the faster memory portion 310, the entire storage device logical capacity is divided in so-called LBA regions. In other words, instead of keeping records of read and/or write access for each LBA, the present disclosure suggests keeping records of accesses performed on a LBA region having a certain size.

For example, a LBA region may have a size of 32 Mbyte and may be considered as an extended memory page.

Each LBA region has a read access counter and/or a write access counter: ReadRegionCnt[i] and/or WriteRegionCnt [i]. These LAB region access counters are stored in the embedded volatile memory portion 315 inside the controller 306. The volatile memory portion 315 is an SRAM memory.

FIG. 4 shows a schematic table 400 representing the data stored in the volatile memory 315 including in a column 410 the logic block addresses which are associated to a column 420 of LBA regions together with a further column 430 of the read region counters. The reported example is based on a 512 Gbyte storage device. A similar table may be implemented for write region counters.

More specifically, the memory structure and method of the present disclosure may be adapted to the writing phase of the memory device providing a write cache memory portion as well as write region counters. In this content the cache memory portion 310 may be structured or configured as a write cache memory portion communicating with write region counters or with LAB access counters stored in the volatile memory portion 315.

In the following of the present disclosure we will make reference to the cache memory portion intending that it may be used for read or write operations even if the example disclosed will be mainly focused on the reading phase.

Just as a further example, if the read counter size is one byte, only sixteen Kbyte of SRAM 315 are required.

The most significant LBA bits of column 410 identify the LBA region to which an LBA belongs to: for instance LBA[26:13] for a 32 Mbyte LBA region size.

The read region counters of column 430 are incremented at each read of one of the corresponding LBA. As an option, counters may be incremented only when read commands have a chunk size lower than a specified threshold. Counters are periodically decremented by a recency algorithm, otherwise all of them will eventually get saturated.

Figure 5:
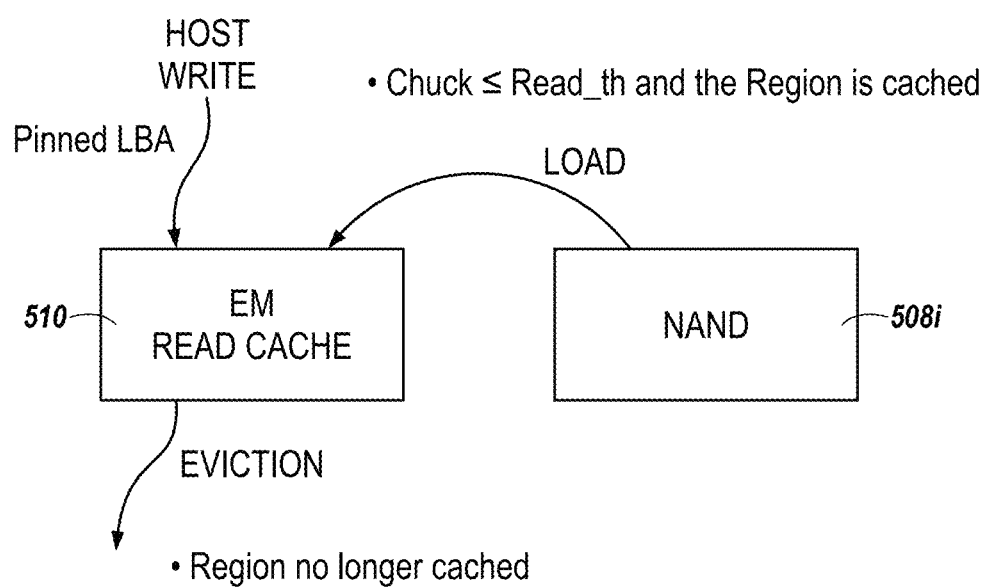
FIG. 5 is a schematic view showing a read cache logical block data and flow in the memory system of the present disclosure.

FIG. 5 is a schematic view showing a read cache logical data and block flow. The block indicated with 510 corresponds to the faster memory portion 310 of FIG. 3 while the memory component 508$i$ represents one of the generic NAND memory portions shown in FIG. 3 with the numbers 3081, . . . , 308N.

The figure shows a data flow represented by arrows wherein a LBA region is cacheable (meaning that its content is preferably stored in the faster memory portion 510) if its counter is equal or greater than a threshold (LoadTh). Logical blocks are copied from the NAND portion 508i to the read cache memory portion 510 when both the following conditions happen:

they are read with a command that has a transfer length equal or lower than a defined threshold;
they belong to a cacheable LBA region.

If both these conditions are met, all the LBAs of the command are copied in non-volatile faster memory portion 510. This memory portion 510 may be configured also as a write cache and not only as a read cache.

It shall be noted that the host controller 302 may provide hints, indicating for instance LBA ranges that should be copied in the faster memory portion 510 because they are frequently read or because they are critical for applications.

Just as an example and for a better comprehension we may consider a real situation wherein an Android operative system installed on the host controller 302 needs to access a read only memory portion including in a system partition the libraries of the operating system that are frequently accessed. In such a case, the host controller 302 may provide hints for storing in the cache faster memory portion 510 just the most frequently accessed libraries.

Therefore, these LBA will be copied in cache faster memory portion 510 when they are written or loaded upon host request. Android system partition is an example of an LBA range that may be pinned, since it is frequently read in short chunk; however other example may be done without limiting the Applicant's rights.

In other words, the LBAs of a LBA region will be copied in the memory portion 510 only if the they are read in short chunk; this is done to avoid the insertion in the group of frequently LBA regions for a region that has been involved in a reading phase only once but with a large number of LBAs included in the same region.

The cache faster memory portion 510 is managed by an algorithm which is responsible to ensure that there is always enough space in the cache faster memory portion 510 to store frequently read LBA.

If the number of free blocks in the memory portion 510 is lower than a predetermined threshold, then some LBA are discarded from such a memory portion 510. This operation is called eviction and is executed during device idle time. A cached memory portion may be considered "evictable" if its counter is lower than a set threshold.

Figure 6:
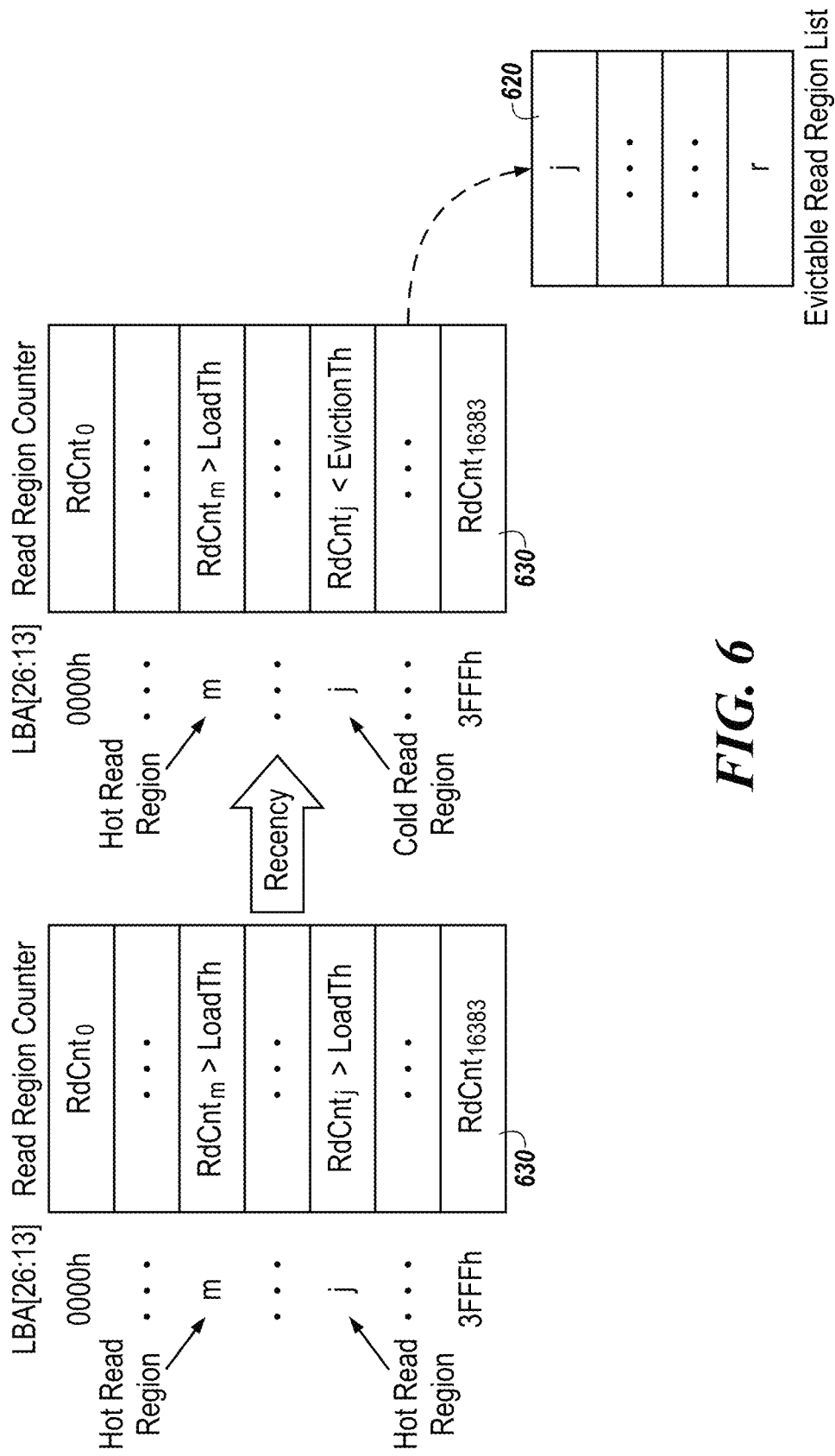
FIG. 6 is a schematic view illustrating the intervention of a recency algorithm active on the memory system of the present disclosure.

FIG. 6 is a schematic view illustrating the intervention of a recency algorithm and the recency events and the evictable LBA regions list updating. The read region counter 630 is equivalent to the read region counter 430 shown in FIG. 4 while the list 620 corresponds to the list 420 shown in FIG. 4 but includes the so-called evictable regions.

On the left side of FIG. 6 it is shown a list 630 including in its central part LBA regions m or j that are frequently read. Therefore, those two regions are the best candidates to be transferred in the cache memory portion 510. All LBA region counters are periodically decremented by a recency algorithm.

Figure 9:
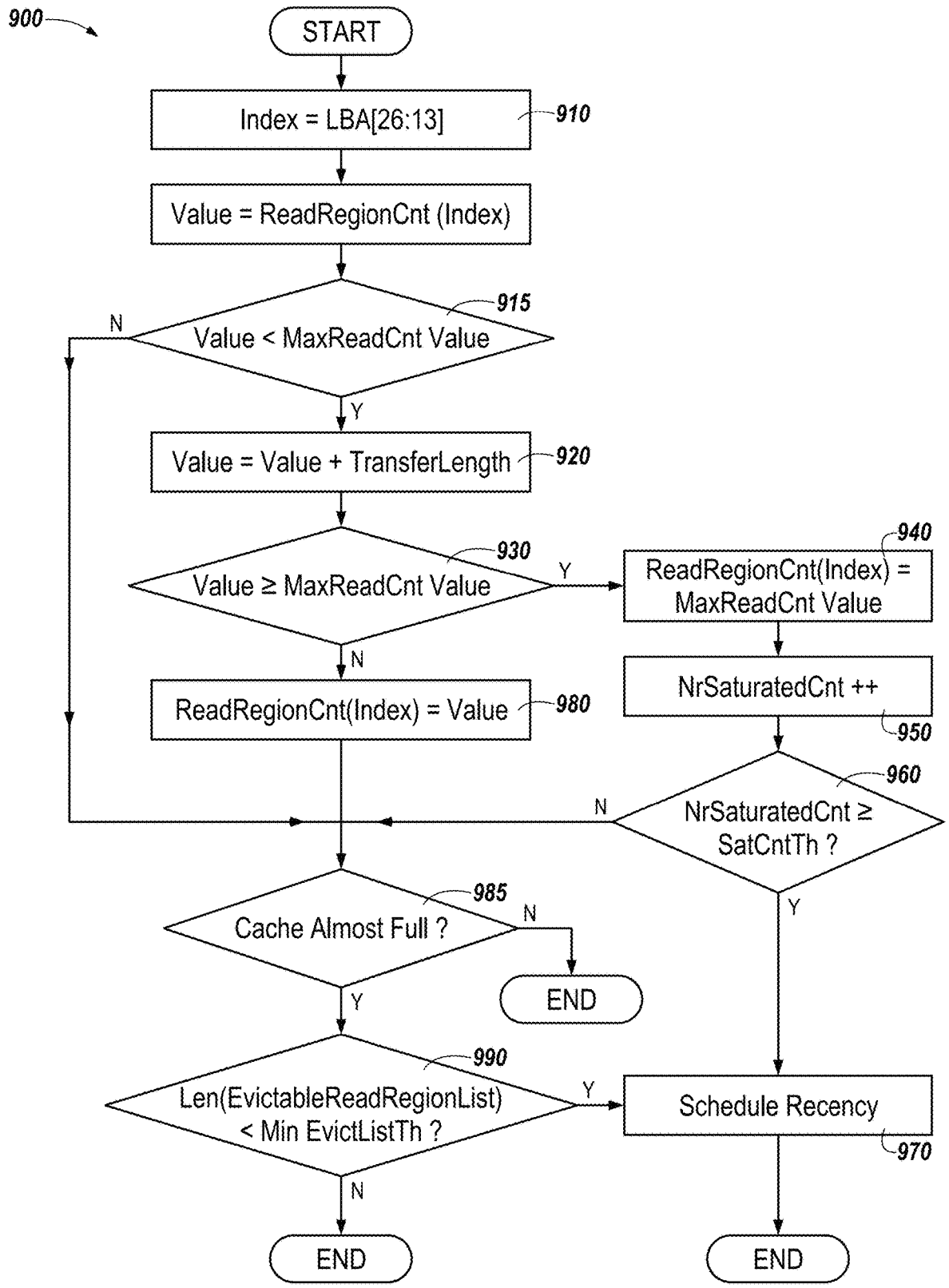
FIG. 9 shows in a flow chart diagram an example of an eviction algorithm periodically used by the memory system of the present disclosure.

The recency algorithm is illustrated in a subsequent FIG. 9 and is activated in a couple of situations: when many read region counters are close to be saturated or when the read cache is close to be full and there are only few elements in the evictable list. The intervention of the recency algorithm renders the system adaptive to the workload and provides real improvement if compared to prior art solutions.

Focusing the attention on the right side of FIG. 6, we may appreciate that the LBA regions m and j that were cacheable before, have changed their respective characteristic. After the recency event the read region counter m remains higher than the load threshold (LoadTh), while the counter of the LBA region j remains on a value lower than the eviction threshold (EvictionTh).

This LBA region j becomes evictable and its index, j, is appended to the evictable LBA region list 620.

It should be noted that during an eviction operation, the read cache management algorithm searches an "evictable" region from the evictable read region list 620, and it discards all the LBAs of that region from the read cache memory portion 510.

It should be further noted that logical blocks present in the read cache 510 have a backup copy in NAND 508i (since the read cache 510 size doesn't contribute to the overall storage device capacity), then there is no data copy during an eviction operation, but only L2P table updates.

Figure 7:
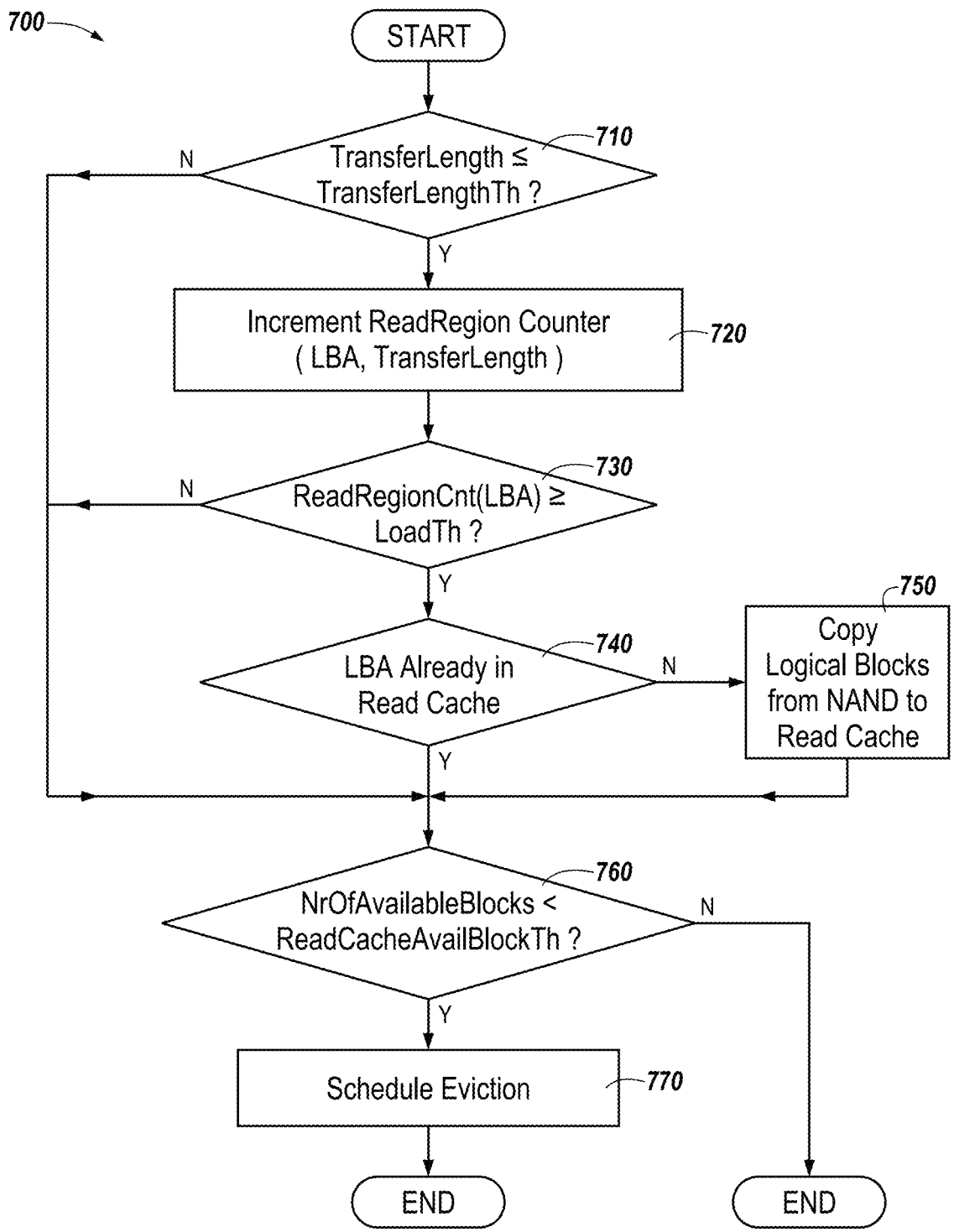
FIG. 7 shows in a flow chart diagram an example of a load operation performed on the memory system of the present disclosure.

FIG. 7 shows in a flow chart diagram 700 an example of a load operation performed on the cache memory portion 510. In a first testing step 710 it is checked if a host controller 302 read command has a transfer length equal or lower than TransferLengthTh. If the answer is positive, in step 720 the counter of the associated LBA region is incremented of an amount equal to the transfer length. A further testing phase is performed in step 730 to check if the counter value is equal or greater than the Load threshold LoadTh.

If the answer is positive the corresponding LBA region is cacheable and a further check is performed in step 740 to evaluate if the LBA is already present in the read cache memory portion 510.

If this further check is negative, then in step 750 all the LBAs of the read command are copied in read cache memory portion 510, if not there yet, after they are retrieved from NAND.

Note that the read region counter is incremented in step 720 only if the command has a transfer length equal or lower than TransferLengthTh. This reduces the risk to promote LBA regions to cacheable regions just after few read commands with high transfer length.

Finally, if the number of free blocks in the read cache memory portion 510 is lower than a threshold ReadCacheAvailBlockTh, in step 770, then an eviction operation is scheduled to discard some LBAs from the read cache memory portion 510.

Figure 8:
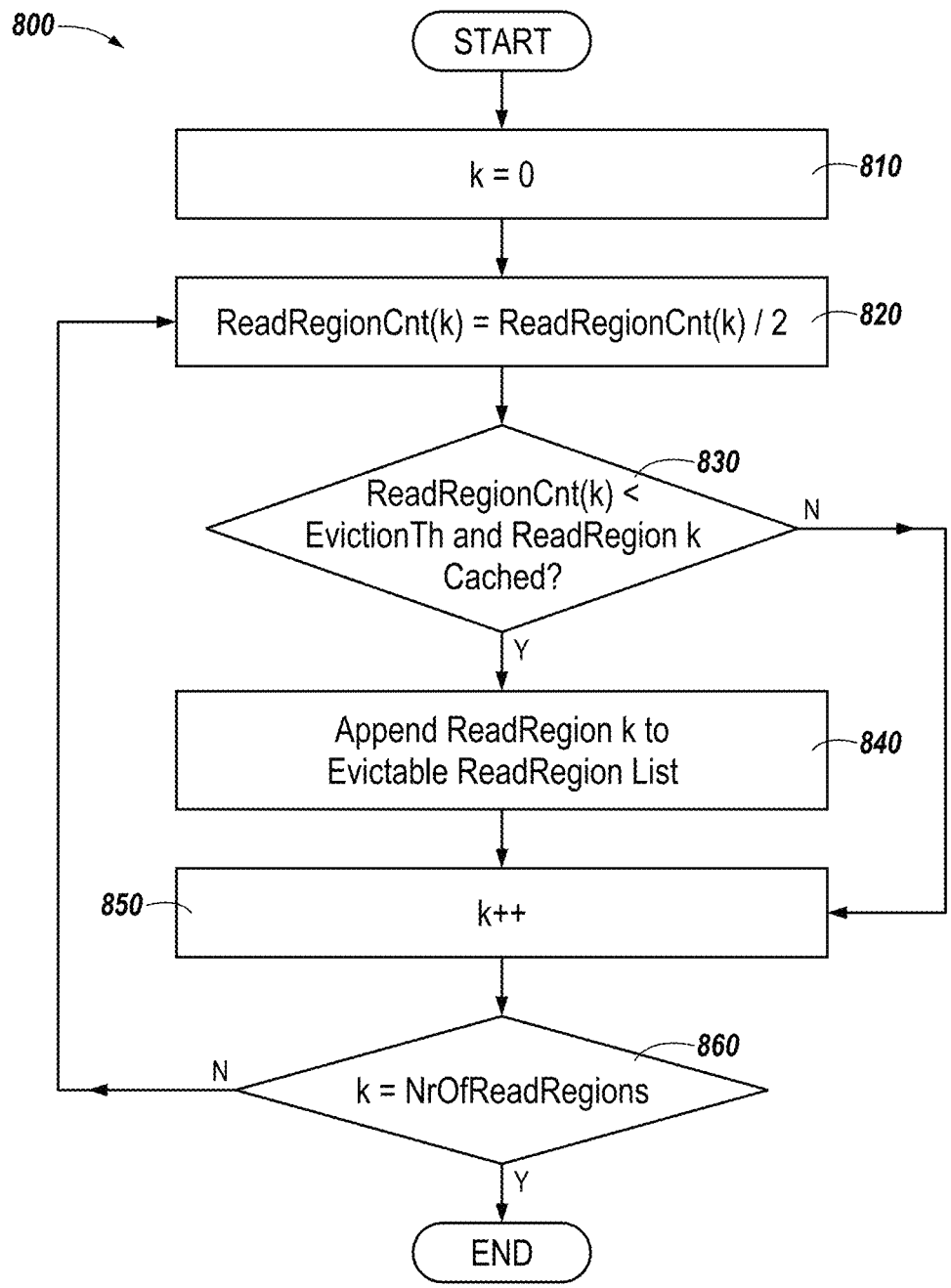
FIG. 8 shows in a flow chart diagram an example of a recency algorithm periodically used by the memory system of the present disclosure.

FIG. 8 shows in a flow chart diagram 800 an example of a recency algorithm, which is periodically used to decrement all read region counters.

In this example of FIG. 8, each counter value is halved during a recency operation. In a first step 810 the k parameter indicating the position of the read region counter is set to "0". Then, in step 820 the value of the k-th counter is halved.

A test step 830 is performed to check if, during the recency operation, the counter associated to a cached LBA region falls down below the threshold EvictionTh. If the answer is positive and at least one LBA belonging to a LBA region was loaded in the read cache memory portion 510 then that region becomes evictable.

In step 840 the evictable region is appended to the evictable LBA region list 620 and that List will be scanned during an eviction operation to select the region whose LBAs will be removed from the read cache memory portion 510.

In step 850, the value of the parameter k is incremented and in step 860 a test is performed to check if the value k is equal the total number of the LBA regions, otherwise the program comes back to step 820.

FIG. 9 shows in a flow chart diagram 900 an example of read region counter management algorithm. This algorithm is initiated in the processing of a read command if the transfer length is lower than or equal to a threshold.

The algorithm starts in step 910 with the identification of the index given by most significant LBA bits that identify the LBA region to which an LBA belong: for instance LBA[26:13].

If the counter is lower than its maximum value (MaxReadCntValue), the counter is incremented by an amount equal to the read command Transfer Length, see step 915 and step 920. The counter eventually saturates to the value MaxReadCntValue in step 930.

If the answer to such a test phase 930 is negative, then the program proceeds to a testing phase 985 through a step 980 wherein the index of the read region counter is updated.

On the contrary, if the answer to the testing step 930 is positive, the number of saturated read region counters is monitored in step 960, after to steps 940 and 950 adapting the read region counter index, to check if this number becomes equal or greater than a defined threshold SatCntTh. A recency event is scheduled to decrement all read region counters in step 970.

In step 985 it is checked if the read cache is almost full, if not the algorithm ends. Otherwise, if the number of evictable LBA region listed in the evictable read region list 620 is lower than a threshold MinEvictListTh, as checked by the step 990, a recency event is scheduled though the step 970.

The eviction step is a background operation, executed for instance during idle time and triggered when the read cache is almost full.

During its execution, one evictable LBA region is selected from the evictable read region list 620 and all the cached LBA belonging to such a list are discarded from the read cache memory portion 510. Searching which LBA of a region are in the read cache can be a long operation, since it requires scanning a significant amount of L2P table entries.

To address this issue, logical block information is stored in a structure called read region linked-list. There is a linked-list for each LBA region present in the read cache memory portion 510.

The physical block address (PBA) indicates where a logical block is stored. A physical block contains logical block data and some metadata information. The read region linked-list is stored in the physical blocks metadata: each metadata contains the PBA of the next logical block copied in read cache memory portion 510 and belonging to the same LBA region.

Figure 10:
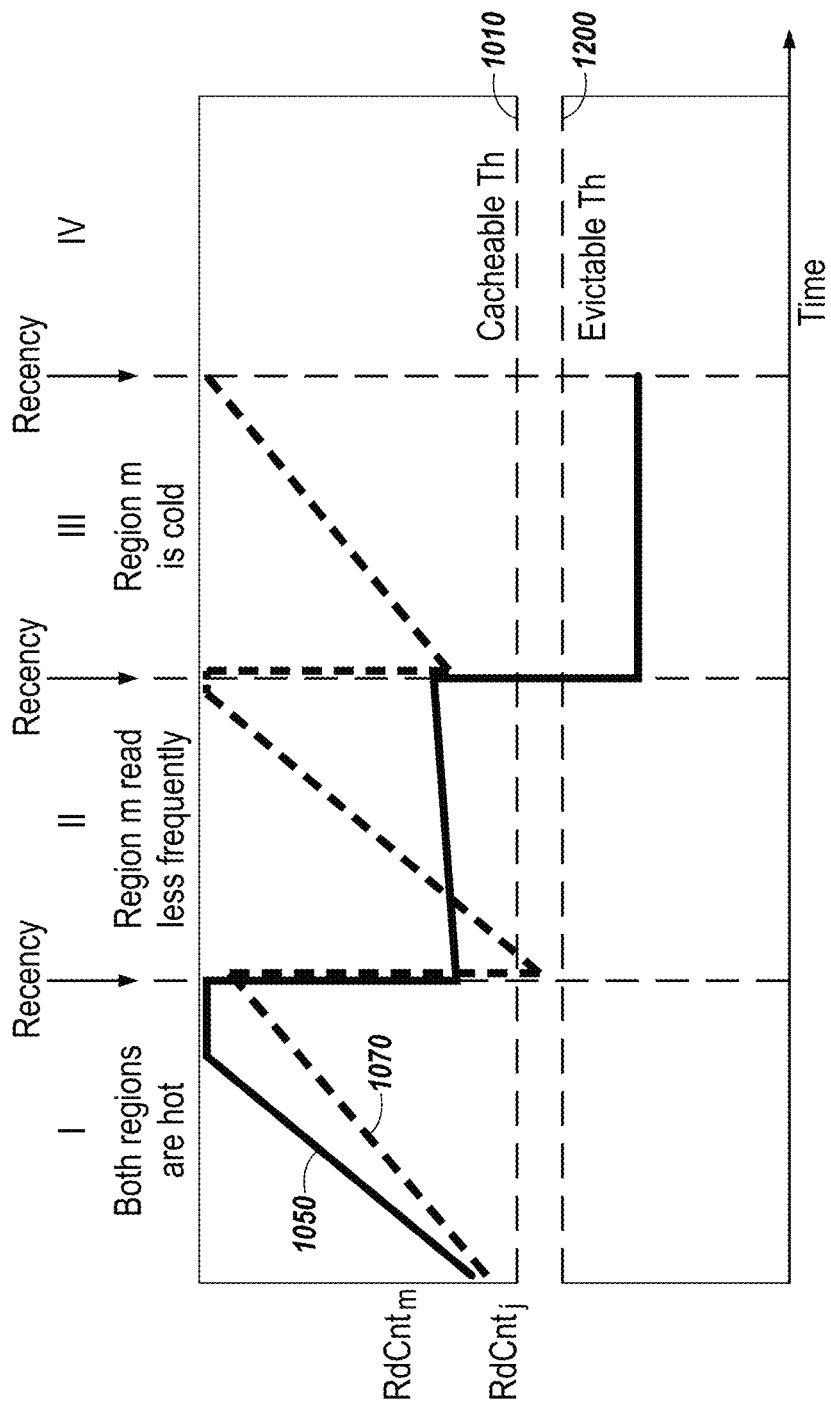
FIG. 10 shows in a diagram a graphic example of the effect of the recency algorithm of FIG. 8 on counters of the memory system of the present disclosure.

FIG. 10 shows in a diagram reporting the increase of counter values versus time a mechanism according to the present disclosure for decrementing periodically the values stored in the counters with the purpose of optimizing the reading phase of the memory regions inside the non-volatile cache memory portion 510.

As it may be appreciated by the diagram, two horizontal lines are indicative of two predetermined thresholds. A first threshold 1010 is indicative of the upper limit over which the value of a counter forces the logical blocks copy of the content of a corresponding memory region inside the cache memory portion when they are read. A second threshold 1020 is indicative of a lower limit under which the value of a counter forces the removal or eviction of the content of a corresponding memory region from the cache memory portion.

A first line 1050 is indicative of the value stored in the read counter RdCnt of a given memory region m, i.e. RdCntm, while a second line 1070 is indicative of the value stored in the read counter of another given memory region j, i.e. RdCntj.

In the first time sector I, both lines are increasing and are indicative of both regions being frequently accessed and considered "hot" so that the counter associated to the first line 1010 reaches a top level indicative of its saturation.

A first recency event is performed between the first time sector I to the second sector II and reduced the value recorded by all the counters. This possible reduction could be for instance a division for two of the stored values, so that all the counters are halved.

As a consequence of this recency, the line 1050 is still over the first threshold level 1010 while the second line 1070 is under the first threshold level 1010.

In the second time sector II, it happens that the memory region j is still frequently accessed and the corresponding line 1070 indicative of the corresponding counter value is increasing much more that the first line 1050 that is no longer so frequently accessed.

Now, a second recency event is performed between the second time sector II and the third time sector III thus lowering even more the value of the counter associated to the memory region j. This value falls now even under the second threshold limit 1020.

This means that the content of the memory region m that was originally copied inside the memory portion 510 may be removed or evicted and its place may be dedicated to copy and storing another memory region that became "hot" in the meantime. The address "m" of this memory portion that is passed from a "hot" state to a so-called "cold" state is inserted in the list 620 of the evictable memory portion whose content will be probably removed from the cache memory portion 510 at the next possible occasion.

It's important to note that the eviction phase requires just a change of a pointer. In other words, no erasing phase is performed on the cache memory portion but simply the memory area or the memory locations corresponding to the content of the "cold" memory region are left at the disposal of a next copying phase of the content of another memory region which became "hot" in the meantime.

To summarize the procedure according to the present disclosure it is worthwhile remaking that the recency phase periodically decrements all read counters and cached read regions that become cold after recency are selected as 'evictable' and appended to an evictable list.

Therefore, a cached LBA belonging to evictable region are discarded during the eviction phase if the cache memory portion is almost full. However, no logical blocks data are copied during Eviction but only the pointers L2P are updated.

For each read memory region present in read cache memory portion, the PBA of the last logical block copied in the read cache is saved in the read cache table 315 stored in the volatile SRAM of the controller. This volatile memory is updated every time a new logical block is inserted in the read cache memory portion.

Figure 11:
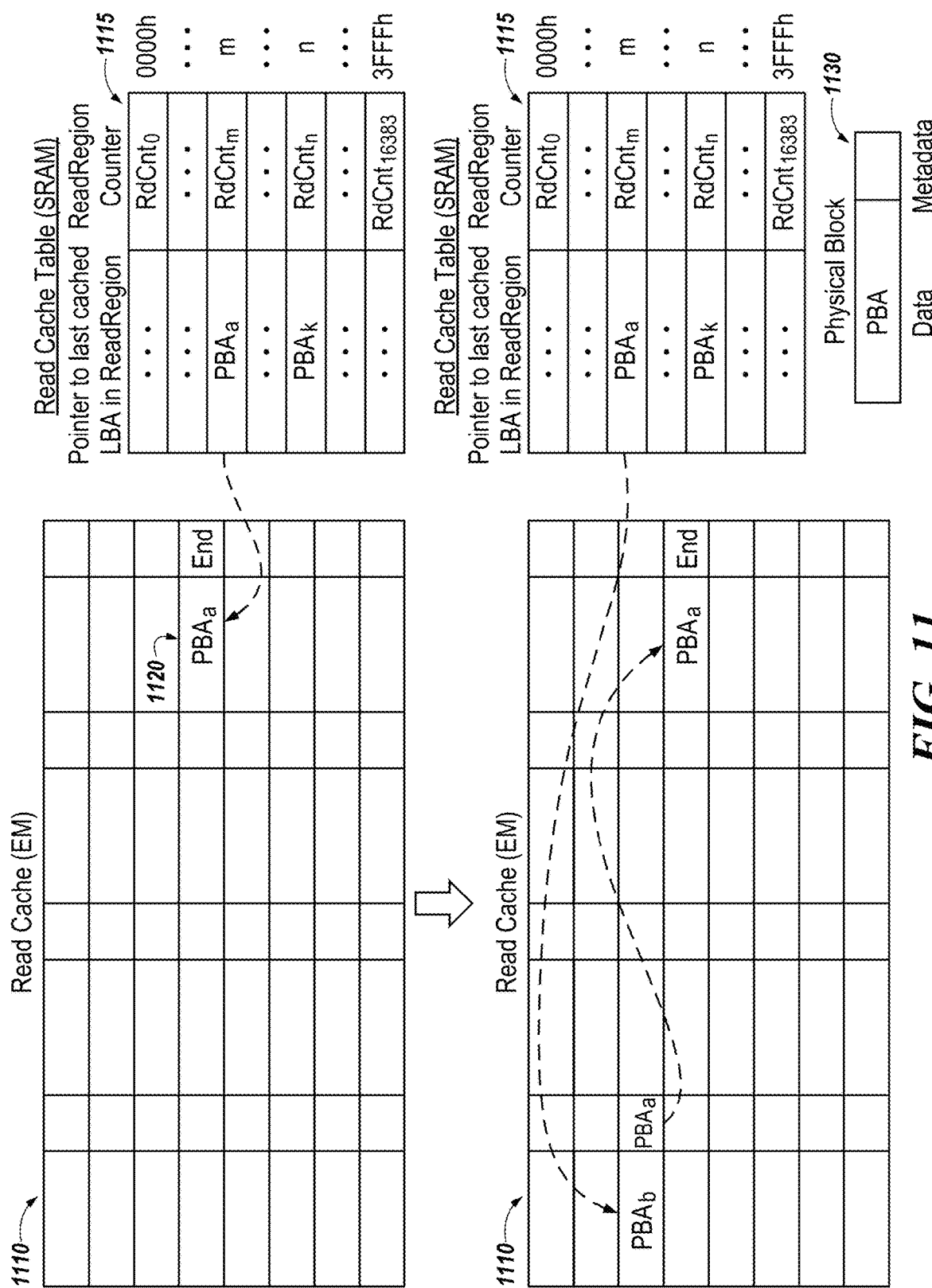
FIG. 11 is a schematic view showing a read cache logical block data and flow in the memory system of the present disclosure.

FIG. 11 illustrates the building process of a linked-list. The first cached LBA of a generic memory region m may be identified as LBAa and is stored in physical block address PBAa shown as 1120 in FIG. 11. This first PBAa is saved in a read cache table (SRAM) 1115 that includes all the pointers to the cached LBA in the read cache memory portion 1110. It must be noted that the read cache memory portion 1110 corresponds to the memory portion 310 of FIG. 3 and to the memory portion 510 of FIG. 5.

Similarly, the volatile memory portion 1115 is equivalent to the memory portion 315 of FIG. 3 contained in the memory controller 306.

When another logical block address LBAb is loaded in the read cache memory portion 1110, then the previous PBAa value is stored in an associated PBAb metadata 1130, while the read cache table 1115 is updated with the value of this PBAb. The process is iterated for all LBAs loaded in the read cache memory portion 1110.

Figure 12:
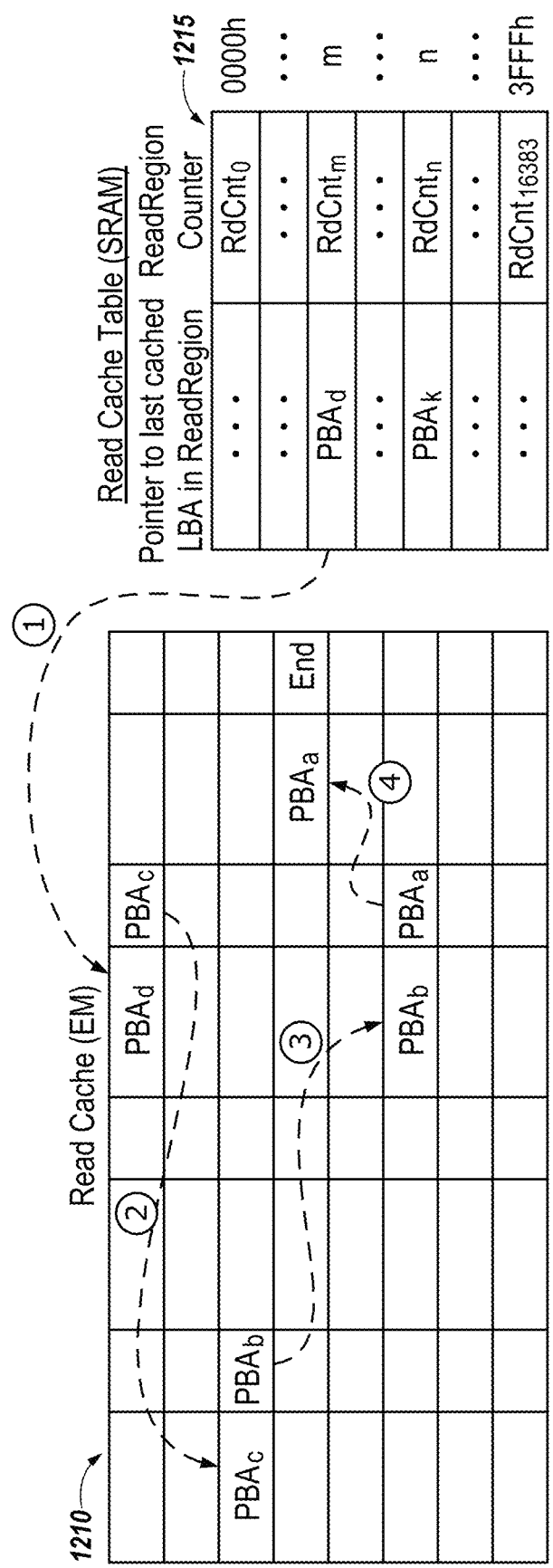
FIG. 12 is a schematic view showing the read cache logical block data and flow of FIG. 11 during an eviction phase according to the present disclosure.
Figure 13:
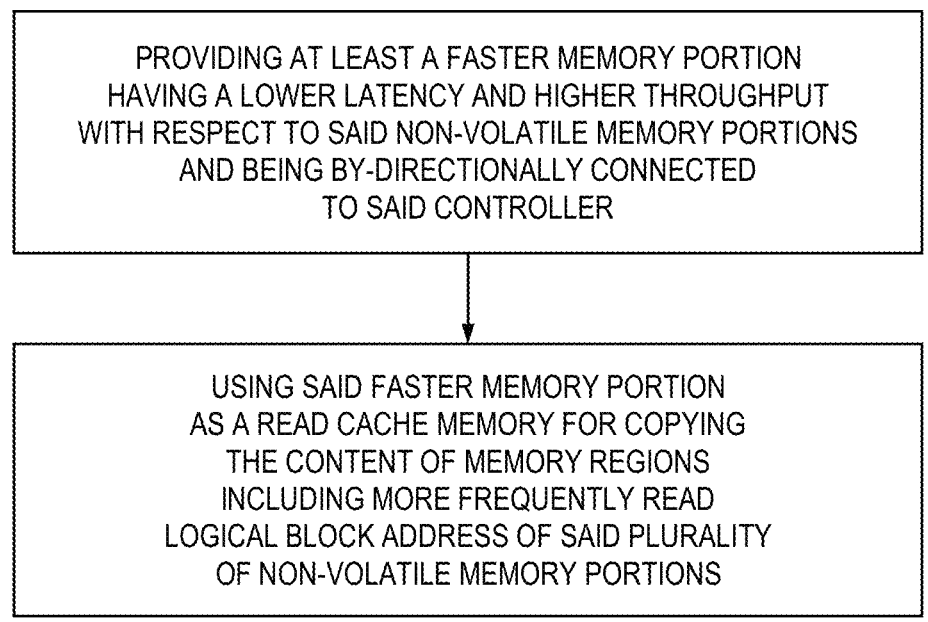
FIG. 13 is a block diagram illustrating the reading method of the present disclosure implemented on a managed storage device.

FIG. 12 shows the linked-list scan process during an eviction phase wherein a read cache memory portion 1210, totally equivalent to the memory portion 1110 of FIG. 11, is rendered available for new frequently read memory regions.

A generic LBA memory region m has been selected to be stored in the read cache memory portion 1210, see the dotted arrow (1) in FIG. 12. As reported in the read cache table 1215, the corresponding physical block address PBAd of line m must be evicted from the read cache memory portion 1210.

Starting from that PBAd, pointed in the read cache table 1215, the four cached LBA (namely: LBAd, LBAc LBAb LBAa) are retrieved following the link stored in metadata fields. The last LBAa of the region can be detected thanks to a specific value stored in its metadata, see the dotted arrows (2), (3) and (4) in FIG. 12.

The read cache architecture and the reading method of the present disclosure achieve the great advantage to speed up the reading phase of a managed storage device including a plurality of non-volatile memory portion such as TLC and/or QLC NAND that are used today to produce big capacity storage devices.

The invention claimed is:

1. A storage device, comprising:
a plurality of non-volatile memory portions;
a controller bi-directionally connected to the plurality of non-volatile memory portions and comprising a volatile memory portion hosting a counter associated with each of the plurality of non-volatile memory portions, wherein:
each of the counters is periodically decremented by a recency algorithm; and
the recency algorithm is activated responsive to a threshold number of counters being close to be saturated or when a cache memory portion of the storage device is within a threshold amount from full; and
a memory portion bi-directionally connected to the controller and having a lower latency and higher throughput as compared to the plurality of non-volatile memory portions,
wherein the memory portion comprises the cache memory portion for frequently accessed memory regions of the plurality of non-volatile memory portions.

2. The storage device of claim 1,
wherein the counter is updated at access of a logical block address of a respective one of the plurality of non-volatile memory portions.

3. The storage device of claim 1, further comprising the controller configured to:
determine logical block addresses of the plurality of non-volatile memory portions that are more frequently read based on a counter that keeps information associated with a plurality of accesses performed on the plurality of non-volatile memory portions;
copy content of the more frequently read portions from the non-volatile memory portions; and
store the copied content in the cache memory portion.

4. The storage device of claim 3, wherein the plurality of accesses comprise a plurality of accesses to chunks of a first size of the more frequently read logical block addresses,
wherein the chunks of the first size are smaller than chunks of a second size associated with the more frequently read logical block addresses.

5. The storage device of claim 3, wherein the controller is configured to store the copied content responsive to the plurality of non-volatile memory portions being read with a command that has a transfer length equal or lower than a defined threshold and belonging to a cacheable logical block address region.

6. The storage device of claim 1, wherein the controller is configured to evict from the cache memory portion content of the plurality of non-volatile memory portions that is no longer frequently accessed by inserting a pointer to the cached memory portion into an evictable read regions table.

7. An apparatus, comprising:
a host device;
a storage device, comprising:
a plurality of non-volatile memory portions; and
a controller bi-directionally connected to the plurality of non-volatile memory portions and configured to determine logical block addresses of the plurality of non-volatile memory portions that are more frequently read based on a counter associated with each of a plurality of memory regions in each of the plurality of non-volatile memory portions that keeps information associated with a plurality of accesses performed on the plurality of non-volatile memory portions,
wherein each of the counters associated with each of the respective memory regions is periodically decremented by a recency algorithm; and
where the recency algorithm is activated responsive to a threshold number of counters being close to being saturated or when a cache memory portion for the plurality of non-volatile memory portions is within a threshold amount from full;
a memory portion bi-directionally connected to the controller and having a lower latency and higher throughput as compared to the plurality of non-volatile memory portions,
wherein the memory portion comprises the cache memory portion for the plurality of non-volatile memory portions; and
a communication channel between the host device and the controller.

8. The apparatus of claim 7, wherein the memory portion is a three-dimensional (3D) cross point memory portion.

9. The apparatus of claim 7, wherein the controller is configured to:
copy content of the more frequently read portions from the non-volatile memory portions; and
store the copied content in the cache memory portion.

10. The apparatus of claim 9, wherein the controller is configured to evict the plurality of non-volatile memory portions including the more frequently read or written logical block addresses from the memory portion when the counter is below a threshold.

11. The apparatus of claim 9, wherein the controller comprises an embedded volatile memory portion to record the counter.

12. A method, comprising:
  reading a logical block address of a respective memory region in each of a plurality of non-volatile portions of a managed storage device,
  updating a counter associated with each respective memory region at a read access to a logical block address of each respective memory region,
    wherein each of the counters associated with each of the respective memory regions is periodically decremented by a recency algorithm;
  copying, to a non-volatile cache portion of the managed storage device, content of a plurality of most-frequently accessed respective memory regions when the counter associated with each respective memory region passes a threshold; and
  activating the recency algorithm responsive to a threshold number of counters being close to be saturated or when the non-volatile cache portion is within a threshold amount from full.

13. The method of claim 12, further comprising copying from the non-volatile cache portion to a memory portion bi-directionally connected to a controller of the managed storage device and having a lower latency and higher throughput as compared to the plurality of non-volatile portions.

14. The method of claim 13, further comprising:
  updating a counter associated with each respective memory region at an access to a logical block address of the respective memory region;
  selecting the respective memory region to be copied in the memory portion responsive to the corresponding counter exceeding a predetermined threshold value.

15. The method of claim 13, wherein memory regions of the non-volatile cache portion including less frequently read logical block addresses are evicted from the memory portion by updating an evictable logical block address regions table including pointers to corresponding memory regions of the non-volatile cache portion.

16. The method of claim 12, wherein each of the counters is updated at an access of the corresponding respective memory region subsequent to the copying of the content.

17. The method of claim 12, wherein:
  the content of the non-volatile cache portion is evicted by the cache portion responsive to a corresponding counter value being under a predetermined threshold; and
  memory locations of the non-volatile cache portion storing the content of the respective memory regions having an access counter under the predetermined threshold are based on a next copying phase of the content of a different memory region.

18. The method of claim 12, further comprising updating the counter subsequent to a reading command having a transfer length equal or lower than a defined threshold.

* * * * *